United States Patent [19]

Theus

[11] Patent Number: 4,901,286
[45] Date of Patent: Feb. 13, 1990

[54] DIGITAL FIFO MEMORY

[75] Inventor: Ulrich Theus, Gundelfingen, Fed. Rep. of Germany

[73] Assignee: Deutsche ITT Industries GmbH, Freiburg, Fed. Rep. of Germany

[21] Appl. No.: 232,064

[22] Filed: Aug. 15, 1988

[30] Foreign Application Priority Data

Oct. 6, 1987 [EP] European Pat. Off. ........ 87114545.4

[51] Int. Cl.$^4$ ............................................. G11C 13/00
[52] U.S. Cl. ................................. 365/230.01; 365/73; 365/238
[58] Field of Search .................. 365/73, 75, 77, 78, 365/230.01, 238

[56] References Cited

U.S. PATENT DOCUMENTS 3,708,690  2/1973  Paivinen ............................... 307/221
3,745,535  7/1973  DeKoe et al. ...................... 340/172.5

OTHER PUBLICATIONS

The Stacking Register—A Simultaneous Input/Output Buffer; G. Philokyprou and A. Zacharacopoulos; Nuclear Instruments and Methods 65 (1968) 202–204.

Primary Examiner—Terrell W. Fears
Attorney, Agent, or Firm—Thomas L. Peterson

[57] ABSTRACT

A digital FIFO memory is disclosed which is formed by a memory cell array (zf) comprising of n signal channels (b1 ... bn) each containing m memory cells (c..1, c..2, c..m−1, c..m) are first, second, and mth clock drivers (tt1, tt2, ttm−1, ttm), respectively, which are controlled by a basic clock signal (g1) and further signals. Thus FIFO memory makes it possible to pass an input data stream arriving at an input data rate (g2) through the FIFO memory in such a way that the output data stream appears at the output (da) at an output data rate (g3) momentarily different from the input data rate (g2). On a time average, however, the two data rates are equal, so that data can be written into and read from the FIFO memory simultaneously at different rates.

18 Claims, 8 Drawing Sheets

DIGITAL FIFO MEMORY

BACKGROUND OF THE INVENTION

1. Field of the Invention

The present invention relates to a digital FIFO (First-In First-Out) memory.

2. Description of the Prior Art

The memory is comprised of n parallel signal channels having their inputs connected to the data input of the memory and having their outputs coupled to the data output of the memory, each signal channel containing m series-connected, identical memory cells each having an enable input, and clock signals being applied to the memory cells in such a way that memory cells which are adjacent in the direction of signal flow are rendered conductive one after the other. Such a FIFO memory is described in U.S. Pat. No. 3,708,690, for example.

The prior art memory cell consists of a level regenerator followed by a transfer transistor. The level regenerator consists of two transistors having their controlled current paths connected in parallel between the clock input and the controlled current path of the transfer transistor. The other end of the current path of this transfer transistor is connected to the gate of one of the level-regenerator transistors of the next memory cell and, through a capacitor, to the reference point for the clock signal, while the gate of the other level-regenerator transistor is connected to the clock input, and the gate of the transfer transistor is the enable input.

This prior art FIFO memory, but also that disclosed in applicant's EP-A 243 528 (ITT case B. Giebel et al 8-2), which was not published prior to the filing date of the present application, are operated exclusively by clock signals derived from a single basic clock signal.

By contrast, the object of the invention as claimed is to improve the prior art FIFO memory and the FIFO memory of the prior referenced application in such as way that an input-data rate is so moved through the FIFO memory that the output-data stream appears at an output-data rate momentarily different from the input-data rate, the two data rates being equal on a time average, however, so that data can simultaneously be written into and read from the FIFO memory at different data rates.

The invention has a similar advantage as that offered by applicant's prior proposal over the prior art described in the U.S. patent referred to above, namely that the above-mentioned capacitor can be dispensed with, so that the amount of area required by the FIFO memory on an integrated-circuit chip is reduced.

BRIEF SUMMARY OF THE INVENTION

A digital FIFO memory is disclosed which is formed by a memory cell array (zf) comprising of n signal channels (b1 ... bn) each containing m memory cells (c ... 1, c ... 2, c ... m−1, c ... m) are first, second, and mth clock drivers (tt1, tt2, ttm−1, ttm), respectively, which are controlled by a basic clock signal (g1) and further signals. Thus FIFO memory makes it possible to pass an input data stream arriving at an input data rate (g2) through the FIFO memory in such a way that the output data stream appears at the output (da) at an output data rate (g3) momentarily different from the input data rate (g2). On a time average, however, the two data rates are equal, so that data can be written into and read from the FIFO memory simultaneously at different rates.

More particularly the invention is a digital FIFO memory comprising insultated-gate field-effect transistors in a memory cell array (zf) of n parallel signal channels (b1 ... bn) having their inputs connected to the data input (de) of the memory and having their outputs coupled to the data output (da) of the memory. Each signal channel containing m series-connected, identical memory cells (c ...) each having an enable input. Clock signals are applied to the memory cells in so that memory cells which are adjacent in the direction of signal flow are rendered conductive one after the other. The input of the respective signal channel is connected directly to the data input (de), and the output to the data output (da). A first clock driver (tt1), a second clock driver (tt2), and an mth clock driver (ttm−1, ttm) are associated with the n first memory cells (c ... 1), the n second memory cells (c ... 2), and the n mth memory cells (c ... m−1, c ... m), respectively. The m clock drivers (tt ...), which are identical in construction, are fed a reset signal (rs) and a basic clock signal (g1) whose frequency is greater than twice the maximum input data rate (g2). Each clock driver (tt ...) has a reset input (rs), and data availability input line (ve) and a data availability output line (va), with the data availability input line (ve) of a clock driver (tt2) connected to the data availability output line (va) of the directly preceding clock driver (tt1), as well as a data request input line (re) and a data request output line (ra), with the data request input line (re) of a clock driver (tt1) connected to the data request output line (ra) of the following clock driver (tt2). The data availability input line (ve) of the first clock driver (tt1) has a signal applied thereto which indicates the presence of valid input data. The data request input line of the last clock driver (ttm) has a signal applied thereto which indicates that a next data word has to be transferred to the output.

In one embodiment each memory cell is comprised of transistors of a single conductivity type, namely a transfer transistor (t) in series with a level regenerator (p), particularly a static inverter, with the gate of the transfer transistor (t) being the enable input.

In another embodiment each memory cell is comprised of CMOS transistors, namely a first P-channel transistor (p1), a second P-channel transistor (p2), a second N-channel transistor (n2), and a first N-channel transistor (n1). These transistors have their controlled current paths connected in series in this order between a positive supply voltage (+u) and the associated negative reference point (−u), with the gates of the first P-channel transistor and the first N-channel transistor connected together to form the input of the memory cell. A clock signal (G1) derived from the output signal (ta) of the clock driver (tt ...) is applied to the gate of the second N-channel transistor (n2). A clock signal inverse thereto (G2) is applied to the gate of the second P-channel transistor (p2). The junction point of the two transistors (p2, n2) is the output of the memory cell.

In yet another embodiment, each memory cell is comprised of transistors of a single conductivity type, namely a series combination formed by the controlled current paths of a first memory-cell transistor (ct1), a second memory-cell transistor (ct2), and a third memory-cell transistor (ct3). Beginning at the live terminal of a supply-voltage source (u), the gate of the third memory-cell transistor (ct3) is the input of the memory cell. The junction point of the first and second memory-cell transistors (ct1, ct2) form the output of the memory cell. A first clock signal (F1) from the clock driver is applied to the gate of the first memory-cell transistor (ct1) and to the end of the series combination not connected to the supply-voltage source (u). A second clock signal (F2) from the clock driver, which is delayed with respect to and overlaps the first clock signal (F1), is applied to the gate of the second memory-cell transistor (ct2).

In each signal channel (b1 ... bn), the first memory cell (c ... 1) is preceded by the demultiplex cell of a demultiplexer (dx), and the last memory cell (c ... m) is followed by the multiplex cell of a multiplexer (mx).

Each demultiplex cell is comprised of a series combination of a first additional memory cell (z ... 1) and a second additional memory cell (z ... 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open. The enable inputs of the other first additional memory cells are controlled by n successively acting input clock signals (e ... ) based on the input data rate (g2), with the first, second, and next-to-last input clock signals (e1, e2, en−1) being applied to the first additional memory cells (z ... 1) in the first signal channel (b1), the second signal channel (b2), and the next-to-last signal channel (bn−1), respectively, and the last input clock signal (en) being applied to all second additional memory cells (z . . 2). The input data rate (g2) is less than or equal to half the n-fold frequency of the basic clock signal (g1).

Each multiplex cell is formed by a series combination of a third additional memory cell (z ... 3) and an additional transfer transistor (zt ... ), with the third additional memory cell (z ... 3) being of the same design as the memory cells (c ... ), and the transfer transistor in the third additional memory cell of the first signal channel (b1) omitted. The gates of the transfer transistors of the multiplex cells are controlled by output clock signals (s ... ) based on the output data rate (g3), with the first output clock signal (s1) being applied to the third additional memory cells (z ... 3) of the second to the last signal channel (b2 ... bn), and the first, second, next-to-last, and last output clock signals (s1, s2, sn−1, sn) being applied to the first, second, next-to-last, and last additional transfer transistors (zt ... ), respectively. The output data rate (g3) is less than or equal to half the n-fold frequency of the basic clock signal (g1).

In another embodiment, each multiplex cell is formed by a series combination of a third additional memory cell (z ... 3) and a fourth additional memory cell (Z ... 4) of the same design as the memory cells (c ... ), with the fourth additional memory cell of the first signal channel (b1) omitted. The enable inputs of these two additional memory cells are controlled by output clock signals (s ... ) based on the output data rate (g3), with the first output clock signal (s1) being applied to the third additional memory cells (z ... 3), and the second, next-to-last, and last output clock signals (s2, sn−1, sn) being applied to the fourth additional memory cells (z ... 4) of the second to the last signal channel (b2 ... bn), respectively. In the first signal channel (b1), the first additional memory cell (z11) is preceded by a static inverter (si) implemented in the same technology (e.g., N-channel, CMOS) as the memory cells. The output data rate (g3) is less than or equal to half the n-fold frequency of the basic clock signal (g1).

The basic clock signal (g1) is the shift signal for a first n-stage ring counter rz1). The stage outputs provide the n input clock signals (e ... ) to which the reset signal (rs) is applied. The reset signal is connected to the data request output line (ra) of the first clock driver (tt1). The output of the last stage is coupled to the data availability input line (ve) of the first clock driver (tt1). The output data rate (g3) is the shift signal for a second ring counter (rz2), whose stage outputs provide the n output clock signals(s ... ), to which the reset signal (rs) is applied. The output of the first stage is coupled to the data request input line (re) of the last clock driver (ttn).

The basic clock signal (g1), the input data rate (g2), and the output data rate (g3) are non-overlapping two-phase signals (f1, f1q; f2, f2q; f3, f3q) of corresponding frequency, the first (f ... ) of each each of which leads the second (f ... q).

In the N-channel clock driver (tt ... ) the data availability input line (ve) is connected to the input of a first inverter (i1) has its output coupled to the first input of a NAND gate (ng). The data availability output line (va) is connected to the output of a first dynamic memory stage (sp1) comprising three transistors (d11, d21, d31) connected in the manner of a differential amplifier between the positive terminal (+u) and the negative terminal (−u) of a DC supply voltage source. The output of the differential amplifier is the junction point of the control current paths of the differential transistors, and to the second input of the NAND gate (ng). The gate of the first differential transistor (d11) is the reset input (rs), and the data request input line (re) is connected to the gate of the second differential transistor (d21). The data request output line (ra) is connected to the output of a clock-switching stage (ss0), to the gate of the third differential transistor (d31), and to the clock output (ta). The output of the NAND gate (ng) is connected to the input of the clock-switching stage (ss) via the controlled current path of a series transistor (lt), to whose gate the second two-phase signal (f1q) of the first basic clock signal (g1) is applied.

The N-channel circuit for the second ring counter (rz2) comprises a plurality of stages. Each stage comprises a master-slave D flip-flop (ff1 ... ffn) and an additional clock-switching stage (ss1 ... ssn). The slave portion of the flip-flop (ff1 ... ffn) has an R input and an S input. Qq output of the flip-flop (ff ... ) is connected to the input of the additional clock-switching stage (ss1 ... ssn). The first two-phase signal (f3) of the output data rate (g3) is applied to the additional clock-switching stage (ss1 ... ssn). The output of the additional clock-switching stage (ss1 ... ssn) is the output for the respective output clock signal (s1 ... st). The reset signal (rs) is applied to the S input of the first flip-flop (ff1) and to the R inputs of the second to the nth flip-flop (ff2 ... ffn). The flip-flops (ff ... ) are connected in a ring circuit by coupling the respective Q output to the D input of the following flip-flop. The output of the first additional clock-switching stage (ss1) is connected to the data request output line (ra) of the nth clock driver (ttn).

The N-channel circuit for the first ring counter (rz1) has a plurality of stages. Each stage comprises a master-slave D flip-flop (ff ... ) having an R input and an S input at the slave portion. An additional clock-switching state (ss ... ) has its first input connected to the Qq output of the flip-flop (ff ... ) and has the first two-phase signal (f2) of the input data rate (g2) applied to its second input. A second dynamic memory stage (sp2)

comprising three transistors (d12, d22, d32) is connected in the manner of a differential amplifier between the positive and negative terminals of the DC supply voltage source. The reset signal (rs) is applied to the S input of the first flip-flop (ff1), to the R input of the second to the nth flip-flop (ff2 . . . ffn), and to the gate of the first differential transistor (d12). The second two-phase signal (f2q) of the input data rate (g2) is applied to the clock inputs of the flip-flops (ff . . . ). The flip-flops (ff . . . ) are connected in a ring circuit by coupling the respective Q output to the D input of the following flip-flop. Connected to the gate of the second differential transistor (d22) is the data request input line (re) of the first clock driver (tt1) and the junction point of the three differential transistors with the data availability output line (va) of the first clock driver (tt1). The gate of the third differential transistor (d32) is connected to the output of the last additional-clock switching stage (ssn).

The N-channel clock-switching stage (ss . . . ) comprises a first transistor (t1) and a second transistor (t2) having their controlled current paths connected in series between the respective first two-phase signal (f2, f3) and the negative terminal (−u). A third transistor (t3) and a second inverter (i2) are connected between the input of the clock-switching stage (ss . . . ) and the gate of the first transistor (t1). The input of the clock-switching stage is connected to the gate of the second transistor (t2). The gate of the third transistor (t3) is connected to the positive terminal (+u) of the supply voltage source. The output of the clock-switching stage is the junction point of the two transistors (t1, t2).

In the N-channel CMOS clock driver (tt . . . ) the data availability input line (ve) is connected to one input of a NOR gate (nr) clocked by two clock signals. Connected between the supply voltage (+u) and its reference point (−u) is the series combination of a second P-channel transistor (pp2), a third P-channel transistor (pp3), and a third N-channel transistor (nn3), with the gate of the second P-channel transistor (pp2) connected to the output of the NOR gate (nr). The junction point of the two third transistors connected through a second static inverter (ci2) to the output for the second clock signal (F2). The output of the NOR gate (nr) is connected to the clock input of an inverter (ei) clocked by a single clock signal. The output of this inverter (ei) is connected to the gate of the first P-channel transistor (pp1) and, through a third static inverter (ci3), to the gate of the third N-channel transistor (nn3) and to the output for the first clock signal (F1). From the basic clock signal (g1), a first pair (m1, m1q) and a second pair (m2, m2q) of nonoverlapping CMOS clock signals are derived. The first signal (m1) of the first pair is applied to the gate of the inverter (ei) clocked by a single clock signal. The first signal (m2) of the second pair is applied to the gate of the third P-channel transistor (pp3), and the second pair (m2, m2q) is applied to the NOR gate (nr).

The invention will now be explained in greater detail with reference to the accompanying drawings.

DETAILED DESCRIPTION OF THE PREFERRED EMBODIMENTS

Figure 1:
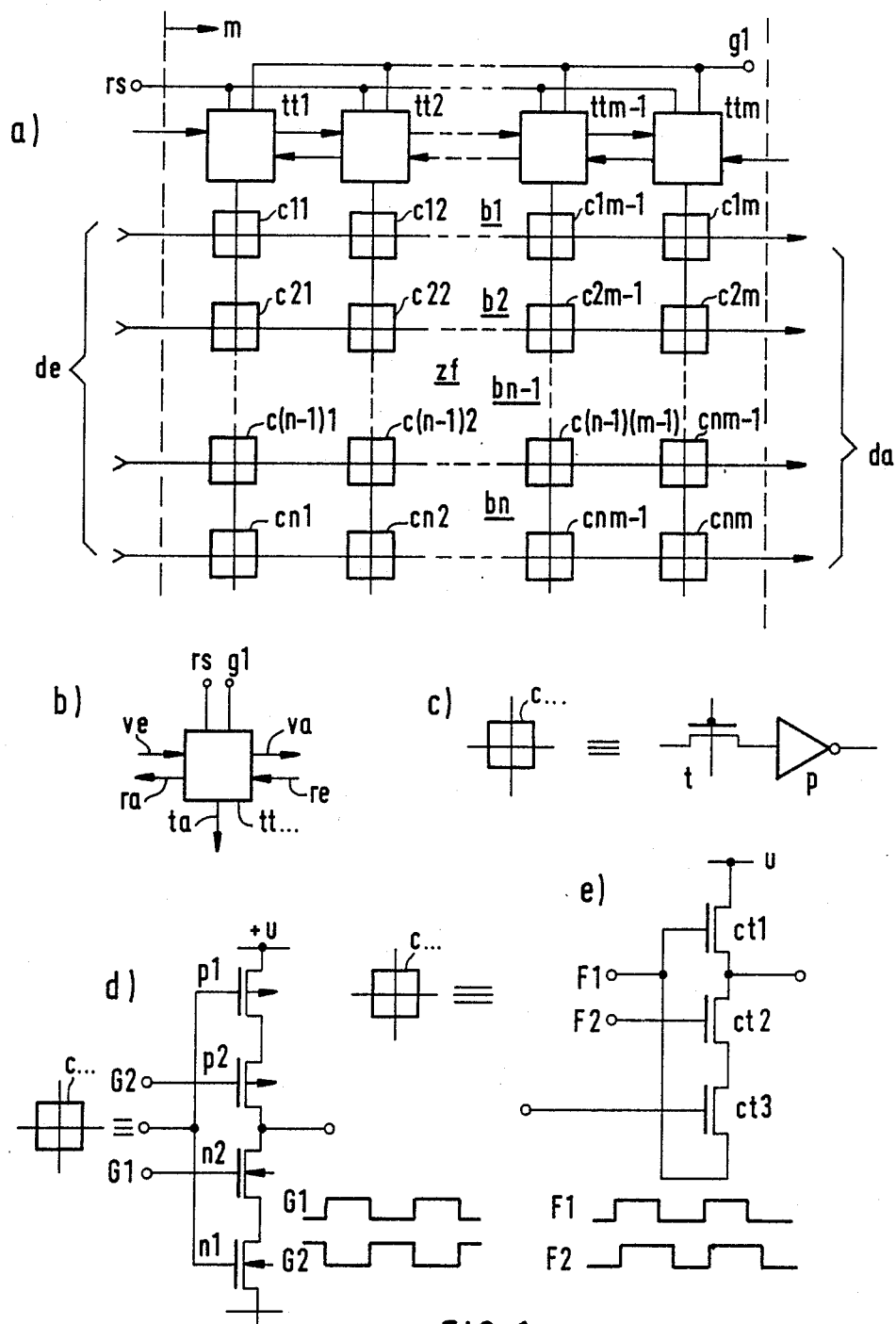
FIG. 1 is a highly schematic circuit diagram of an embodiment of the cell array together with three different circuit variants of a memory cell.

Of n possible parallel signal channels, the channels b1, b2 . . . bn−1, bn are shown in the highly schematic circuit diagram of FIG. 1a. The signal channel b1 contains the first memory cell c11, the second memory cell c12, the next-to-last memory cell c1m−1, and the last memory cell c1m. The corresponding memory cells in the second signal channel b2 are denoted by the reference characters c21, c22, c2m−1, c2m, those in the next-to-last signal channel bn−1 by the reference characters c(n−1)1, c(n−1)2, c(n−1)(m−1), c(n−1)m, and those in the last signal channel by the reference characters cn1, cn2, cnm−1, cnm. All these memory cells form the cell array zf.

Associated with each of the m cells of equal order in the signal channels is a clock drive tt . . . , whose clock output ta is connected to the enable inputs of the associated memory cells. Thus, the clock driver tt1 is associated with all first memory cells c . . . 1, the clock driver tt2 with all second memory cells c . . . 2, the clock driver ttm−1 with all next-to-last memory cells c . . . (m−1), and the clock drive ttm with all last memory cells c . . . m.

As can be seen in FIG. 1, each clock driver tt . . . has the data availability input line ve, the data availability output line va, the data request input line re, and the data request output line ra. The data availability input line ve of a clock drive, e.g., the clock driver tt2, is connected to the data availability output line va of the directly preceding clock driver, i.e., the clock driver tt1. The data request input line re of a clock driver, e.g., the clock driver tt1, is connected to the data request output line ra of the following clock driver, i.e., the clock driver tt2. The basic clock signal g1 is applied to the clock inputs of the clock drivers tt . . . , which deliver the output signal ta.

FIG. 1c shows a schematic circuit diagram of a first variant of the memory cells. The transfer transistor t is followed by the level regenerator p. In the drawings, they are united in a small square for simplicity.

FIG. 1d shows the circuit diagram of a second variant of the memory cells, namely a CMOS memory cell. It consists of the series combination of the controlled current paths of the first P-channel transistor p1, the second P-channel transistor p2, the second N-channel transistor n2, and the first N-channel transistor n1 between the positive supply voltage +u and the negative reference point −u, with the gates of the first P-channel transistor and the first N-channel transistor connected together and forming the input of the memory cell. The clock signal G1, derived from the output ta of the clock driver tt..., is applied to the gate of the second N-channel transistor n2, and the inverse clock signal G2 is applied to the gate of the second P-channel transistor p2. The junction point of the two transistors p2, n2 is the output of the memory cell.

FIG. 1e shows the circuit diagram of a third variant of the memory cells using transistors of a single conductivity type, preferably N-channel transistors. Connected to the positive terminal +u of the supply-voltage source is the series combination of the controlled current paths of the first, second, and third memory-cell transistors ct1, ct2, ct3, the gate of the latter being the input of the memory cell. The junction point of the first and second memory-cell transistors ct1, ct2 forms the output of the memory cell. The first clock signal F1 from the clock driver is applied to the gate of the first cell transistor ct1 and to the end of the series combination not connected to the terminal +u, and the second clock signal F2 from the clock driver, which is delayed with respect to and overlaps the first clock signal F1, is presented to the gate of the second cell transistor ct2.

Figure 2:
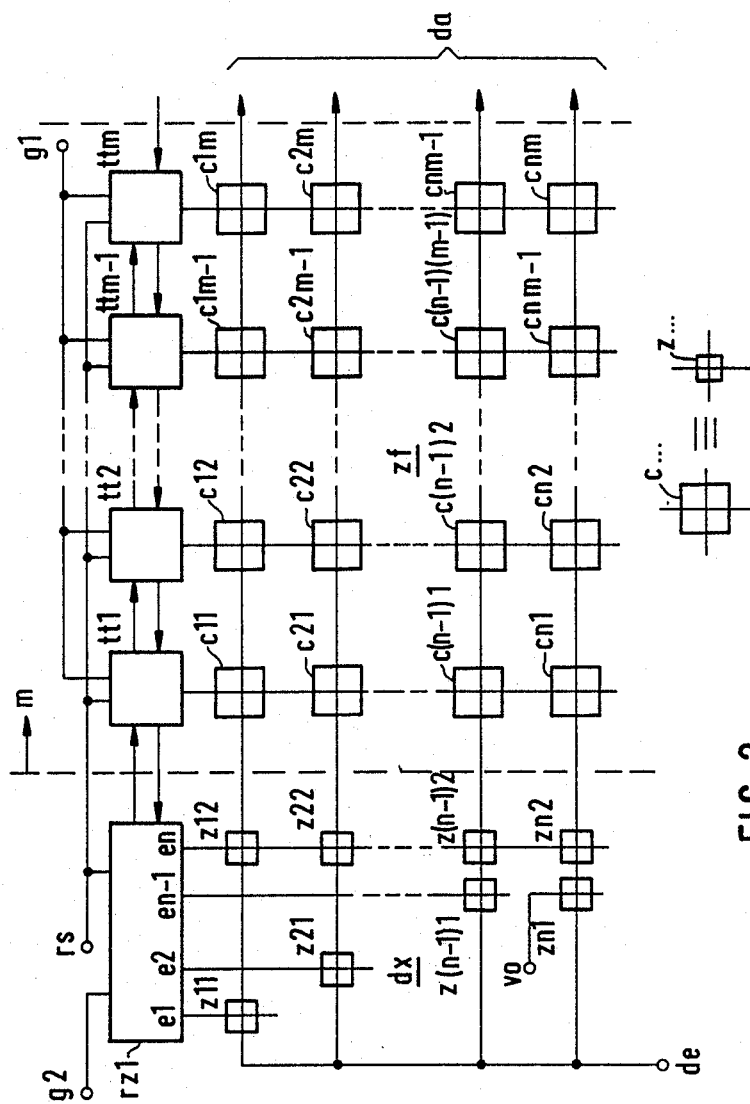
FIG. 2 shows the cell array of FIG. 1 together with an input demultiplexer.

FIG. 2 shows the cell array of FIG. 1 together with the demultiplexer dx connected between the cell array and the data input de. In each signal channel b..., the demultiplexer dx has a demultiplex cell which is formed by the series combination of a first additional memory cell z...1 and a second additional memory cell z...2. The two additional memory cells have the same internal circuit as the memory cells of the cell array; they are constructed either as shown in FIG. 1c or as shown in FIG. 1d. The first signal channel b1 contains the series-connected additional memory cells z11, z12, the second signal channel b2 the additional memory cells z21, z22, the next-to-last signal channel bn−1 the additional memory cells z(n−1)1, z(n−1)2, and the last signal channel bn the additional memory cells zn1, zn2, with the enable input of the additional memory cell zn1 connected to the potential vo, which keeps the input of this cell constantly open, so that data can be constantly transferred into this cell. The inputs of the first additional memory cells z...1 are connected to the data input de of the FIFO memory.

The enable inputs of the demultiplex cells are controlled by n input clock signals e1, e2, en−1, en, which are based on the input data range g2, as follows. The first additional memory cell z11 in the first signal channel b1 is controlled by the first input clock signal e1, the first additional memory cell z21 in the second signal channel b2 by the second input clock signal e2, and the first additional memory cell z(n−1)1 in the next-to-last signal channel bn−1 by the next-to-last input clock signal en−1, while all second additional memory cells z...2 are controlled by the last input clock signal en. The input data rate g2 is the clock rate at which the input data is transferred to the data input de.

Figure 3:
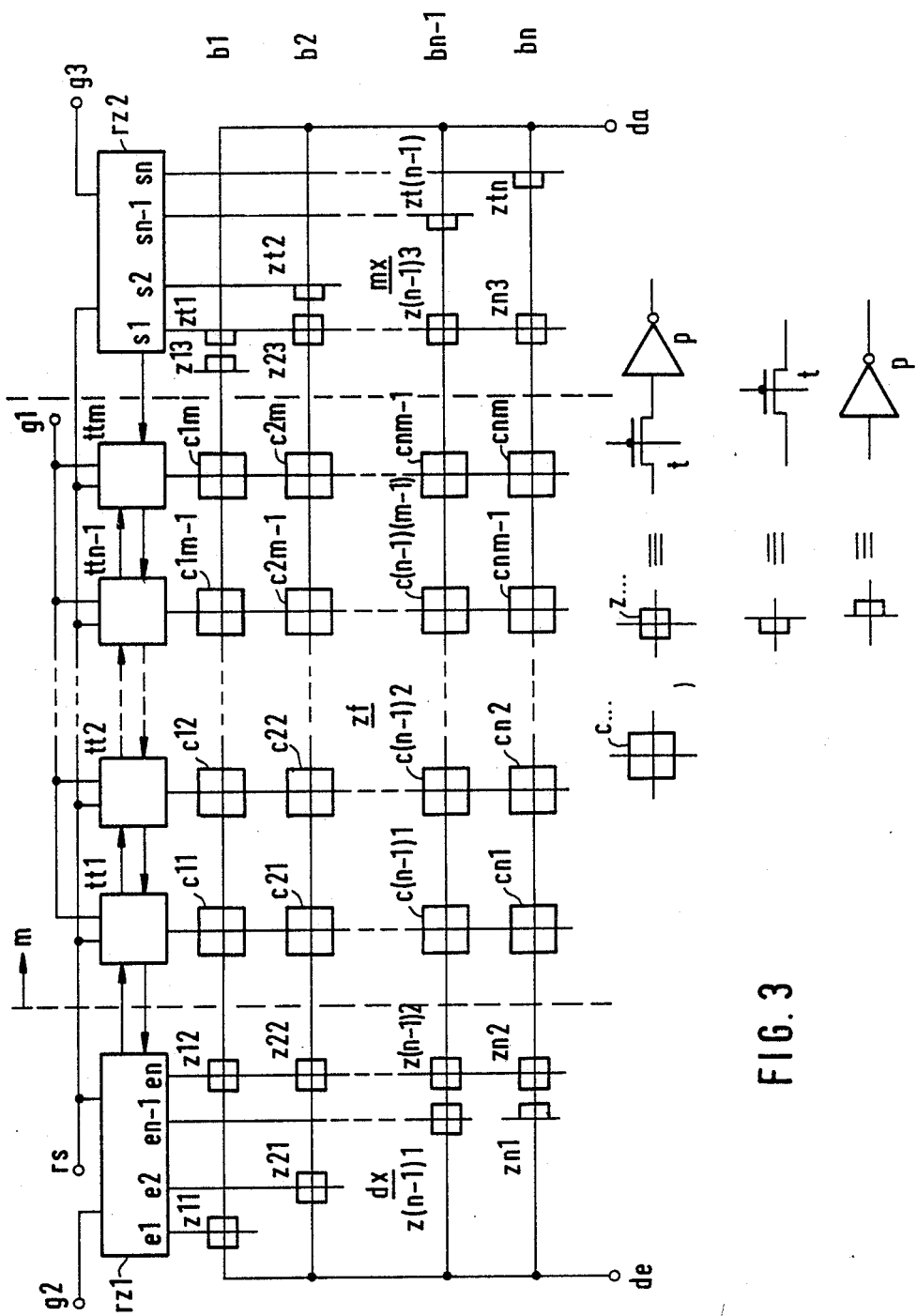
FIG. 3 shows the cell array of FIG. 1 together with an input demultiplexer and an output multiplexer for memory cells as shown in FIG. 1c.

FIG. 3 shows an arrangement as illustrated in FIG. 2 and using memory cells as shown in FIG. 1c. Connected between the data output da and the cell array zf is the multiplexer mx. In each signal channel b..., the multiplexer mx has a multiplex cell consisting of the third additional memory cell z...3, in series with the additional transfer transistor zt...; in the multiplex cell of the first signal channel b1, however, the additional transfer transistor of the third additional memory cell z13 is not present. In the second signal channel b2, the multiplex cell thus consists of the third additional memory cell z23 and the additional transistor zt2; in the next-to-last signal channel bn−1, it consists of the additional memory cell z(n−1)3 and the additional transfer transistor zt(n−1), and in the last signal channel bn, it consists of the additional memory cell zn3 and the additional transfer transistor ztn. The outputs of the additional transfer transistors zt2, zt(n−1), ztn are connected to the data output da of the FIFO memory.

The gates of the transfer transistors of the multiplex cells of FIG. 3 are controlled by the output clock signals s1, s2, sn−1, sn, which are based on the output data rate g3, as follows. The third additional memory cells z23, z(n−)3, zn3 of the second to the last signal channel are controlled by the first output clock signal s1, and the additional transfer transistors zt... of the signal channels b1... bn are controlled by the first, second, and last ouptut clock signals s1... sn, respectively. The output data rate g3 is the clock rate at which the output data is read from the data output da.

Both the active pulses of the input clock signals e.... and those of the output clock signals s..., which turn the respective transfer transistors on, follow each other in time without overlapping one another. The input data rate g2 and the output data rate g3 are less than or equal to half the n-fold frequency of the basic clok signal g1.

In FIG. 3, the first additional memory cell zn1 of the last signal channel is shown to be constituted only by the level regenerator p, because the transfer transistor t, which is constantly turned on by the potential vo in FIG. 2, can be omitted.

Figure 4:
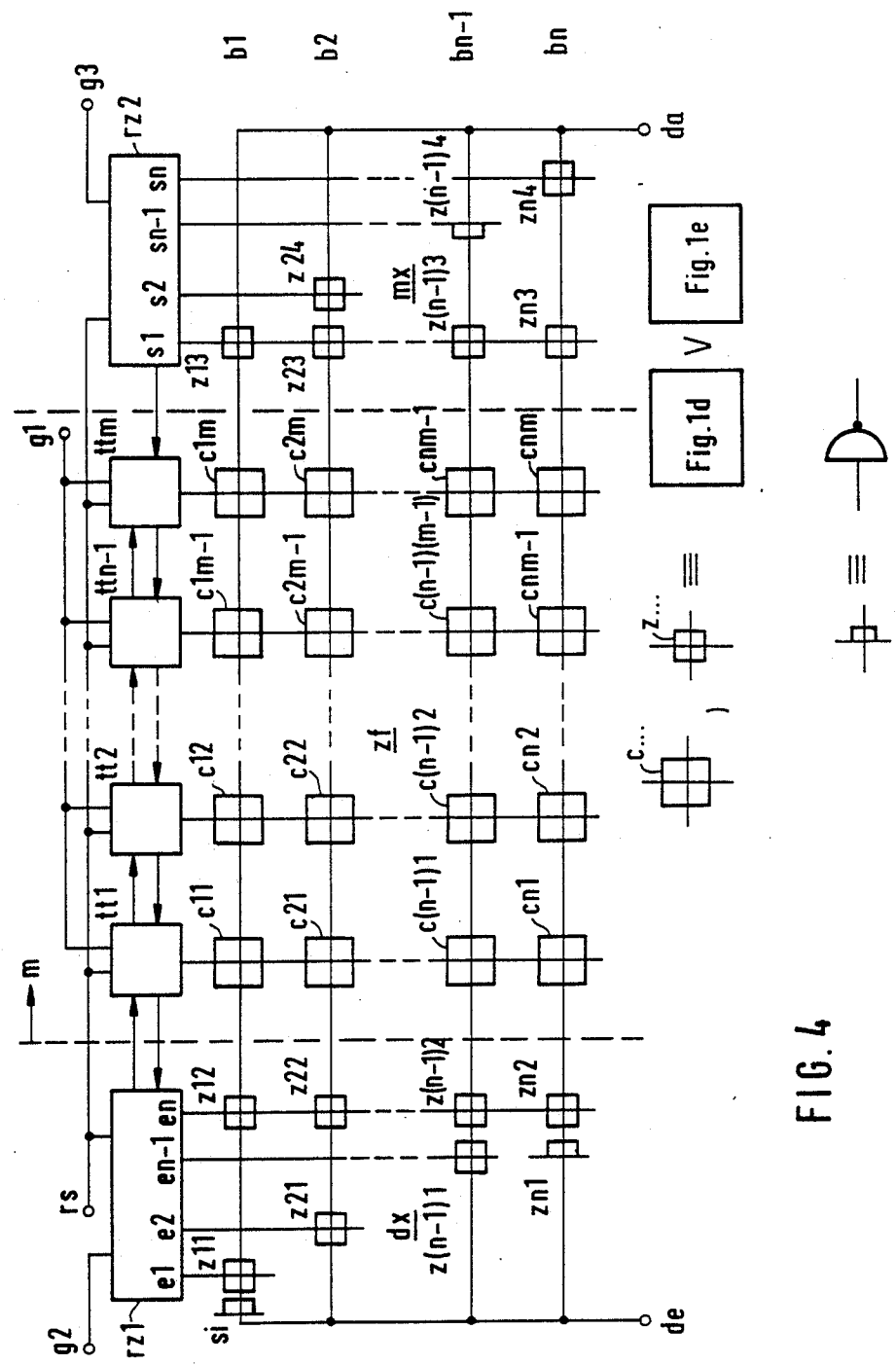
FIG. 4 shows a cell array corresponding to that of FIG. 3, but for memory cells as shown in FIG. 1d or 1e.

FIG. 4 shows an arrangement as illustrated in FIG. 2 and using memory cells as shown in FIG. 1d or FIG. 1e. Connected between the data output da and the cell array zf is the multiplexer mx. Each multiplex cell is formed by the series combination of the third additional memory cell z...3 and the fourth additional memory cell z...4, there being no fourth additional memory cell in the first signal channel b1. The enable inputs of these two additional memory cells are controlled by output clock signals s..., which are based on the output data rate g3, as follows. The third additional memory cells z...3 are controlled by the first output clock signal s1, and the fourth additional memory cells z...4 of the second to the last signal channels b2... bn are controlled by the second, next-to-last, and last output clock signals s2, sn−1, and sn, respectively.

In the first signal channel b1, the first additional memory cell z11 is preceded by a static inverter si which is implemented in the same technology (e.g., N-channel, CMOS) as the memory cells. The frequency of the input clock signals e... and the output clock signals s... is again less than or equal to half the n-fold frequency of the basic clock signal g1.

In a preferred embodiment of the invention, the n input clock signals e1... en and the n output clock signals s1... sn are produced by the first n-stage ring counter rz1 and the second n-stage ring counter rz2, respectively. Both ring counters are fed with the reset signal rs. The input data rate g2 is the shift signal for the first ring counter rz1, which will generally be implemented as a feed-back shift register. The outputs of the n stages provide the input clock signals e... The ring counter rz1 is connected to the data request output line ra of the first clock driver tt1, and the output of the last stage is coupled to the data availability input line ve of the first clock driver tt1.

The output data rage g3 is the shift signal for the second ring counter rz2, whose stage outputs provide the n output clock signals s . . . The output of the first stage of the ring counter rz2 is coupled to the data request input line re of the last clock driver ttn.

Preferably, the basic clock signal g1, the input data rate g2, and the output data rate g3 are nonoverlapping two-phase signals f1, f1q; f2, f2q; f3, f3q, in which the first signal f . . . leads the second signal f . . . q.

Figure 5:
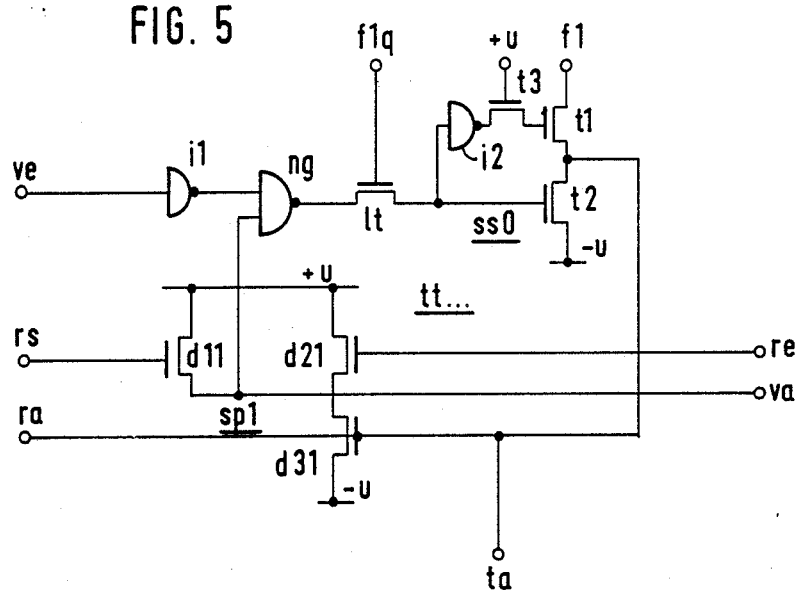
FIG. 5 is a circuit diagram of an embodiment of a clock drive containing N-channel transistors.

FIG. 5 shows a circuit diagram of a preferred embodiment of a clock driver tt . . . in N-channel technology. The data availability input line ve is connected to the input of the first inverter i1, whose output is coupled to the first input of the NAND gate ng. The data availability output line va is connected to the output of the first dynamic memory stage sp1, which contains three transistors d11, d21, d31 connected in the manner of a differential amplifier between the positive terminal +u and the negative terminal −u of the DC supply voltage source, henceforth called "differential transistors" for the sake of simplicity. This output is the junction point of the three differential transistors. The data availability output line va is also connected to the second input of the NAND gate ng.

The reset line rs is connected to the gate of the first differential transistor d11, and the data request input line re to the gate of the second differential transistor d21. The data request output line ra is connected to the output of the clock-switching stage ss0, to the gate of the third differential transistors d31, and to the clock input ta.

The output of the NAND gate ng is connected via the controlled current path of the series transistor 1t, to whose gate the second two-phase signal f1g of the first basic clock signal g1 is applied, to the input of the clock-switching stage ss0. The latter is constructed as follows. The first and second transistors t1, t2 have their controlled current paths connected in series between the first two-phase signal f1 of the basic clock signal g1 and the negative terminal −u of the DC supply voltage source. The second inverter i2 and the third transistor t3 are interposed between the input of the clock-switching stage ss0 and the gate of the first transistor t1, with the input of the clock switching stage ss0 also connected to the gate of the second transistor t2, and its output being the junction point of the two transistors t1, t2. The gate of the third transistor t3 is connected to the positive terminal +u of the supply-voltage source.

Figure 6:
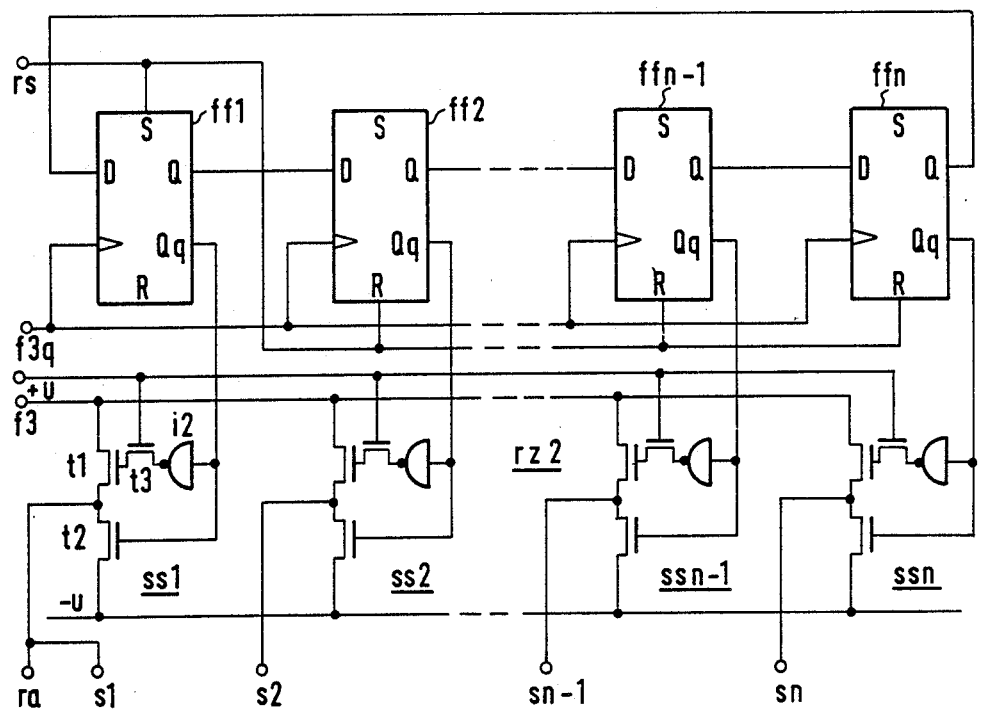
FIG. 6 is a circuit diagram of an embodiment of the ring counter providing the clock signals for the output multiplexer.

FIG. 6 shows a circuit diagram of a preferred embodiment of the second ring counter rz2 in N-channel technology. Each stage of the second ring counter rz2 consists of the master-slave D flip-flop ff1 . . . ffn, having an R input and an S input at the slave portion, and the additional clock-switching stage ss1 . . . ssn, which has its input connected to the Qq output of the master-slave D flip-flop ff . . . and is fed by the first two-phase signal f3 of the output data rate g3. For simplicity, the master-slave D flip-flops will hereinafter be referred to as "flip-flops".

The structure of the additional clock-switching stages ss1, ss2, ssn−1, ssn is identical with the structure of the clock switching stage ss0 of FIG. 5, which was explained above.

The reset signal rs is applied to the S input of the first flip-flop ff1 and to the R inputs of the second to the nth flip-flop ff2 . . . fn. The second two-phase signal f3q of the output data rate g3 is applied to the clock inputs of the flip-flops ff . . . , which are connected in a ring circuit as the respective Q output is coupled to the D input of the following flip-flop with the Q output of the last flip-flop ffn coupled to the D input of the first flip-flop ff1. Connected to the output of the first additional clock-switching stage ss1 is the data request output line ra of the nth clock driver ttn.

Figure 7:
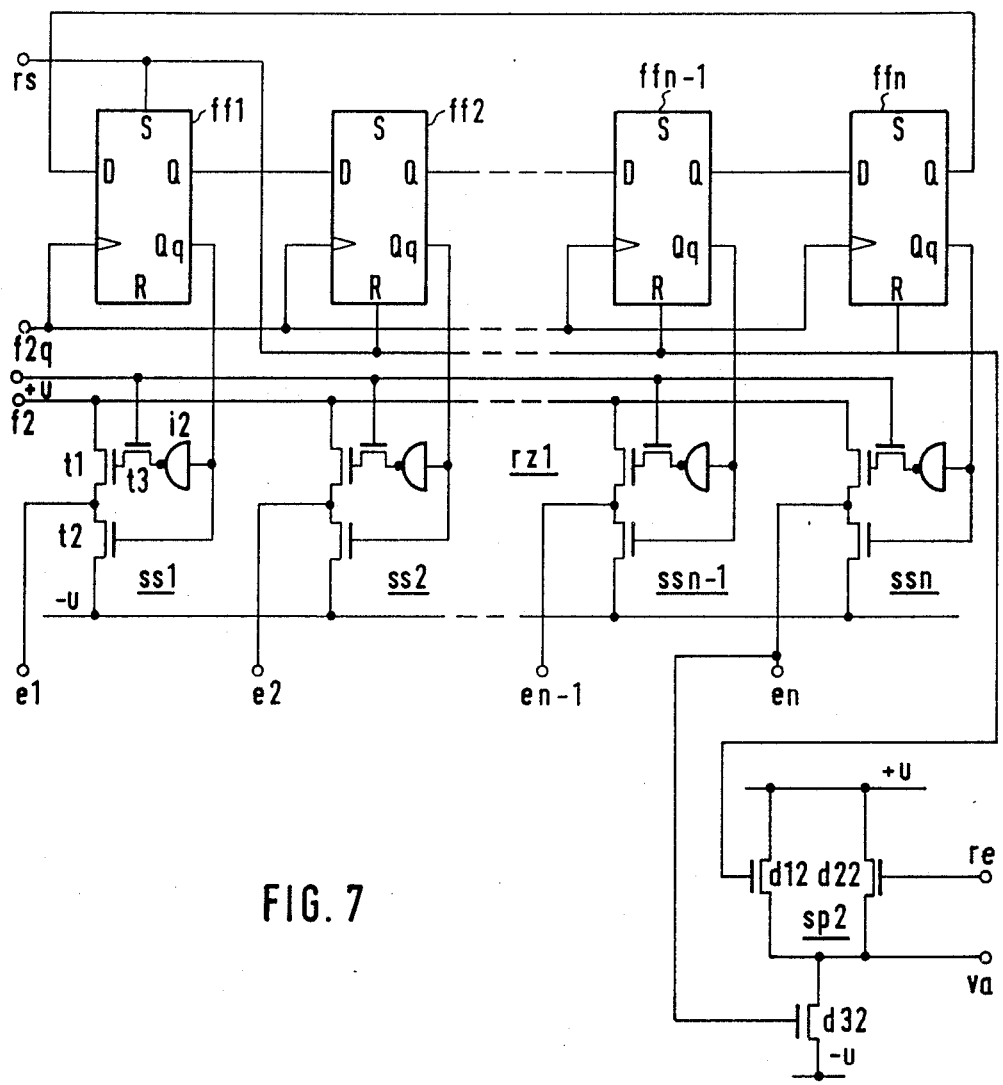
FIG. 7 is a circuit diagram of an embodiment of the ring counter providing the clock signals for the input demultiplexer.

FIG. 7 shows a preferred embodiment of the first ring counter rz1 of FIG. 1 in N-channel technology. It is identical in construction to the second ring counter rz2 of FIG. 3 but additionally contains the second dynamic memory stage sp2, consisting of the three differential transistors d12, d22, d32 interconnected in a differential-amplifier configuration. In this second memory stage sp2, the reset signal rs is applied to the gate of the first differential transistor d12, and the output en of the last count stage, which is also the output of the last clock-swtiching stage ssn, is applied to the gate of the third differential transistor d32. Connected to the gate of the second differential amplifier d22 is the data request input line re of the first clock driver tt1, and the output is connected to the data availability output line va of this clock driver. The second two-phase signal f2q of the input data rate g2 is applied to the clock inputs of the flip-flops ff1 . . . ffn, while the associated first two-phase clock signal f2 is fed to the clock-switching stages ss1 . . . ssn.

Figure 8:
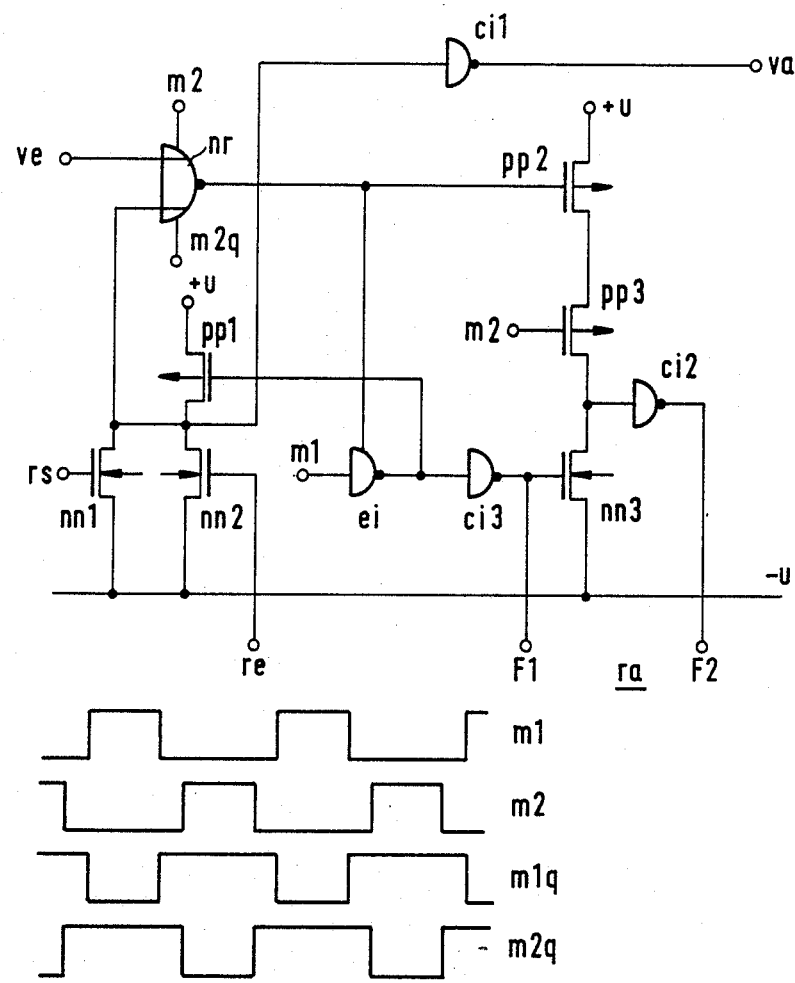
FIG. 8 is a circuit diagram of an embodiment of a CMOS clock driver.

FIG. 8 shows a preferred embodiment of a CMOS clock driver tt . . . for a memory array in N-channel technology.

The data availability input line ve is connected to one input of the NOR gate nr, which is clocked by two clock signals. The controlled current path of the first N-channel transistor nn1 is connected between the other input of the NOR gate nr and the negative reference point −u of the supply voltage source +u, the gate of the first N-channel transistor nn1 being the reset input rs. Connected between the supply voltage +u and its reference point −u is the series combination of the controlled current paths of the first P-channel transistor pp1 and the second N-channel transistor nn2, whose junction point is connected to the other input of the NOR gate nr and, through the first static inverter ci1, to the data availability output line va.

Connected between the supply voltage +u and its reference point −u is the series combination of the second P-channel transistor pp2, the third P-channel transistor pp3, and the third N-channel transistor nn3, with the gate of the second P-channel transistor pp2 connected to the output of the NOR gate nr, and the function point of the two third transistors connected through the second static inverter ci2 to the output of the second clock signal F2. The output of the NOR gate nr is connected to the clock input of the inverter ei, which is clocked by a single clock signal. The output of this inverter ei is connected to the gate of the first P-channel transistor pp1 and, through the third static inverter ci3, to the gate of the third N-channel transistor nn3 and to the output for the first clock signal F1. From the basic clock signal g1, the first pair m1, m1q and the second pair m2, m2q of nonoverlapping CMOS clock signals are derived, the first signal m1 of the first pair being applied to the gate of the inverter ei, the first signal m2 of the second pair being applied to the gate of the third P-channel transistor pp3, and the second pair m2, m2q being applied to the NOR gate nr.

Figure 9:
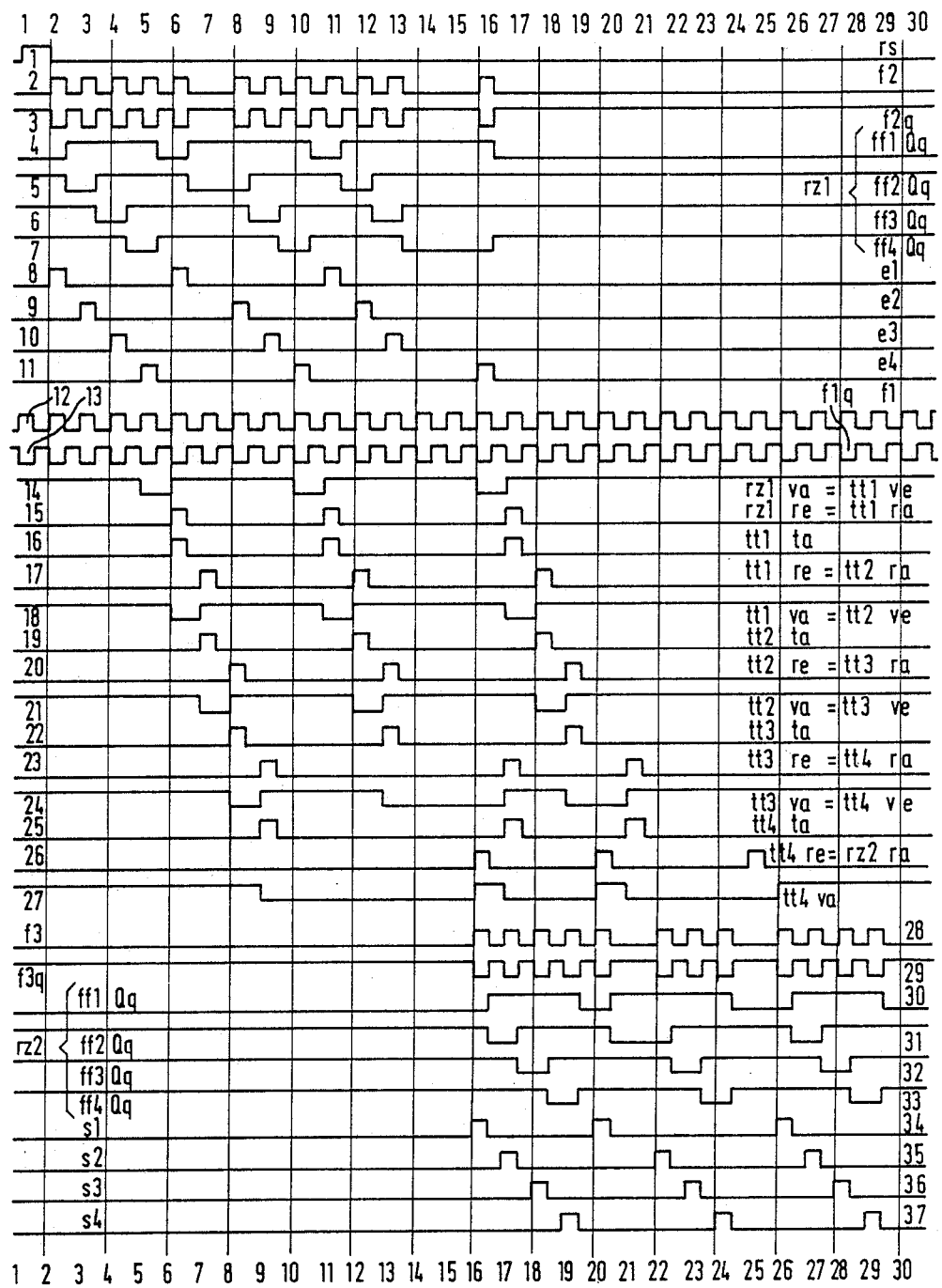
FIG. 9 shows a family of signal waveforms which occur in an arrangement as shown in FIGS. 3 and 5 to 7 if m=n=4.

FIG. 9 shows a family of signal waveforms which occur in a practical embodiment of the invention according to FIGS. 3 and 5 to 7 if m=n=4. i.e., if the cell array consists of 4×4 memory cells. The variations with time are shown for 30 clock periods of the two two-phase signals f1, f1q of the basic clock signal g1, the individual clock periods being numbered consecutively from 1 to 30 in the top and bottom lines of FIG. 9.

Also, the signal waveforms, drawn one below the other in FIG. 9, are provided with consecutively written reference characters from the associated figures, so that the circuit points at which the individual signals occur are clearly identified. The compound reference character rz1ff2Qq, for example, denotes the Qq output of the flip-flop ff2 of the ring counter rz1 of FIG. 7. Because of the concrete 4×4 cell array, the consecutive numbers n−1 and n of FIGS. 3, 6 and 7 appear in FIG. 9 as the consecutive numbers 3 and 4, so that the reference character rz2ff3Qq, for example, denotes the Qq output of the flip-flop ffn−1 of the ring counter rz2 of FIG. 6.

The individual curves of FIG. 9 are numbered consecutively from 1 to 37 from top to bottom. The individual numbers are placed either below the signal level if the latter is the more positive one of the two binary levels, i.e., the H level, or above the signal level if the latter is the L level at the location of the number. The number 1, for example, stands below the H level of the signal rs, while the number 4 stands above the L level of the signal rz1ffQq. the numbers 1 to 27 stand at the lef-hand edge of the family of curves, and the numbers 28 to 37 at the right-hand edge. In the following description, these numbers are used to identify the respective curves or lines of FIG. 9, while the horizontal number sequences at the top and the bottom of FIG. 9 serve to number the clock periods of the instants.

In lines 12 and 13, the two two-phase signals f1, f1q of the basic clock signal g1 are shown as continuous curves, which indicates that in operation, the basic clock signal g1 is constantly applied to the FIFO memory of the invention. Line 1 shows the reset signal rs, which is at the H level during clock period No. 1 and places the FIFO memory in the zero or initial state. Curves 2 and 3 show the two second two-phase signals f2, f2q, which are derived from the clock signal at whose pulse repetition rate the input data is transferred to the data input de. For FIG. 9 it is assumed that no input data is fed to the data input de during clock period nos. 7, 14, 15, and 17 to 30, so that during these clock periods the two-phase signals are at the L level.

Only for ease of illustration and, thus, for the sake of clarity of FIG. 9, the second two-phase signals f2, f2q and the first and third two-phase signals f1, f1q and f3, f3q have the same periods in this figure, the signal delays caused by gates, etc., being unaccounted for.

Curve no. 4 shows that at the beginning of the second half of clock period no. 2, the Qq output of the flip-flop ff1 of the first ring counter rz1 assumes the H level. This is due to the fact that during the H level of the reset signal rs, only the Q output of the flip-flop ff1 is at the H level, while the Q output of the other flip-flops are at the L level, because the reset signal is applied to the R inputs of the other flip-flops and, thus, to the D input of the flip-flop ff1.

This L level is transferred to the Q output when the second two-phase signal f2q assumes an H level, i.e., at the beginning of the second half of clock period no. 2. At that instant, however, the H level at the DS input of the flip-flop ff2 is transferred to the Q output of this flip-flop, and it remains there and at the D input of the flip-flop ff3 during clock period No. 3, so that on the L to H transition of this clock period, the H level is transferred to the Q output of the flip-flop ff3. On the L to H transition of clock period no. 4, therefore, the Q output of the flip-flop ff4 and the D input of the flip-flop ff1 are at the H level, and the Qq ouput of the individual flip-flops provide the signals inverse to the signals at the Q outputs. This is illustrated by curve nos. 5 to 7; the interval in the clock signals f2, f2q during the clock period no. 7 reappears in the signals of curves 4 to 7 with corresponding time shifts.

Curve nos. 8 to 11 show the outputs of the clock-switching stages ss1 . . . These outputs are obtained as follows, which will be explained with the aid of curve no. 8 and the clock-switching stage ss1. During the H level of the two-phase signal f2, the Qq output of the flip-flop ff1 is at the L level, which turns the transistor t2 off and is changed by the inverter i2 to an H level, which is applied to the gate of the transistor t1, so that the latter is turned on, the H level of the two-phase signal f2 thus being transferred to the output e1. On the occurrence of an H level at the Qq output, the transistor t2 is turned on and the H level is changed to the L level by the inverter i2, so that the transistor t1 is turned off and the output e1 is pulled to the potential −u, so that the L level appears at e1 again.

The H level appearing at the output e1 during the first half of clock period no. 2 also appears at the outputs e2, e3, e4 with relative shifts of one clock period, i.e., at the beginning of clock period nos. 3 to 5, as is shown in curve nos. 9 to 11. When the H level appears at the output e4 at the beginning of clock period no. 5, the data availability output line va of the ring counter z1, which is identical with the date availability input line ve of the clock driver tt1, assumes the L level. This is caused by the dynamic memory cell sp2 of FIG. 7 as follows. The gate of the differential transistor d12 has the rest signal rs applied to it and is therefore at the L level, so that this differential transistor is off. On the other hand, the differential transistor d32 is turned on by the H level of the signal e4, so that, since the signal at the gate of the differential transistor d22 is the L level, too (see curve no. 15), the junction point of the three differential transistors is at the L level. This L level is maintained during clock period no. 5.

Curve no. 15 shows the data request input signal re for the ring counter rz1, which is identical with the data requires output signal ra of the clock driver tt1, because it comes from the latter: In FIG. 5, during clock period no. 5, the input of inverter i1 is at the L level, so that the output is at the H level. Since, on the other hand, the data availability output line va is at an H level (see curve no 18), the output of the NAND gate ng is at the L level. This L level is not transferred to the input of the inverter i2 until the second two-phase signal f1q assumes the H level so that the L level at the output of the inverter i2 still keeps the transistor t1 off, while the transistor t2 is on as a result of the H level at the output of the NAND gate ng, so that the signal at the output ta is at an L level.

Since the first two-phase signal f1 is transferred to the output ta already in the second half of clock period no. 5, so that an L level exists there, the output ta assumes the H level of f1 at the beginning of clock period no. 6. As a result, va goes to the L level, and the output of the NAND gate to the H level. However, since the latter is transferred by the second two-phase signal f1q to the inverter i2 only at the beginning of the second half of clock period no. 6, the states of the second half clock period no. 5 is preserved in the clock-switching stage ss0 during the first half of clock period no. 6. When the series transistor 1t is turned on at the beginning of the second half of clock period no. 6, the transistor t2 turns on, too, while the transistor t1 is turned off, so that the output ta goes to the L level. Thus, this output is at the H level only during the first half of clock period no. 6 and then during the first halves of clock period nos. 11 and 17, as shown in curve 16.

The other clock drivers tt2, tt3, tt4 operate in the same manner as the clock driver tt1 just described, but with relative time shifts, as is illustrated by curve nos. 19 to 27. In these curves, the above-mentioned interval in the two-phase signals f2, fd2q during clock period no. 7 reappear with a corresponding time shift.

Curve nos. 28 and 29 show the two third two-phase signals f3, f3q, at whose pulse repetition rate the output data is read from the data output da. During clock period nos. 21 and 25, no output data is read, so that the two two-phase signals f3, f3q are at the L level during those clock periods.

Curve nos. 30 to 33 show the signals at the Qq outputs of the flip-flops ff1 . . . ff4 of the second ring counter rz2 of FIG. 6, which drives the clock-switching stages ss1 . . . ss4. The outputs of the latter provide the output clock signals s1 . . . s4, curve nos. 34 to 37. The operation of the individual stages of FIG. 6 is identical with the operation of the corresponding stages of FIG. 7.

Many modifications and alterations may be made by those having ordinary skill in the art without departing from the spirit and scope of the invention. Therefore, the illustrated embodiment has been shown only for the purposes of example and should not be taken as limiting the invention as defined in the following claims.

I claim:
1. A digital FIFO memory comprising:
insulated-gate field-effect transistors and a memory cell array (zf) of n parallel signal channels (b1 . . . bn) having their inputs connected to the data input (de) of the memory and having their outputs coupled to the data output (da) of the memory;
each signal channel containing m series-connected, identical memory cells (c . . . ) each having an enable input; and
clock signals being applied to the memory cells in so that memory cells which are adjacent in the direction of signal flow are rendered conductive one after the other;
wherein the input of the respective signal channel is connected directly to the data input (de), and the output to the data output (da);
wherein a first clock driver (tt1), a second clock driver (tt2), and an mth clock driver (ttm−1, ttm) are associated with the n first memory cells (c . . . 1), the n second memory cells (c . . . 2), and the n mth memory cells (c . . . m−1, c . . . m), respectively;
wherein the m clock drivers (tt . . . ), which are identical in construction, are fed a reset signal (rs) and a basic clock signal (g1) whose frequency is greater than twice the maximum input data rate (g2);
wherein each clock driver (tt . . . ) has a reset input (rs), and data availability input line (ve) and a data availability output line (va), with the data availability input line (ve) of a clock driver (tt2) connected to the data availability output line (va) of the directly preceding clock driver (tt1), as well as a data request input line (re) and a data request output line (ra), with the data request input line (re) of a clock driver (tt1) connected to the data request output line (ra) of the following clock driver (tt2);
wherein the data availability input line (ve) of the first clock driver (tt1) has a signal applied thereto which indicates the presence of valid input data; and
wherein the data request input line of the last clock driver (ttm) has a signal applied thereto which indicates that a next data word has to be transferred to the output.

2. The digital FIFO memory of claim 1 wherein each memory cell is comprised of transistors of a single conductivity type, namely a transfer transistor (t) in series with a level regenerator (p), particularly a static inverter, with the gate of the transfer transistor (t) being the enable input.

3. The digital FIFO memory of claim 1 wherein each memory cell is comprised of CMOS transistors, namely a first P-channel transistor (p1), a second P-channel transistor (p2), a second N-channel transistor (n2), and a first N-channel transistor (n1) having their controlled current paths connected in series in this order between a positive supply voltage (+u) and the associated negative reference point (−u), with the gates of the first P-channel transistor and the first N-channel transistor connected together to form the input of the memory cell, that a clock signal (G1) derived from the output signal (ta) of the clock driver (tt . . . ) is applied to the gate of the second N-channel transistor (n2), that the clock signal inverse thereto (G2) is applied to the gate of the second P-channel transistor (p2), and that the junction point of the two transistors (p2, n2) is the output of the memory cell.

4. The digital FIFO memory of claim 1 wherein each memory cell is comprised of transistors of a single conductivity type, namely a series combination formed by the controlled current paths of a first memory-cell transistor (ct1), a second memory-cell transistor (ct2), and a third memory-cell transistor (ct3) and beginning at the live terminal of a supply-voltage source (u), the gate of the third memory-cell transistor (ct3) being the input of the memory cell, the junction point of the first and second memory-cell transistors (ct1, ct2) forming the output of the memory cell, a first clock signal (F1) from the clock driver being applied to the gate of the first memory-cell transistor (ct1) and to the end of the series combination not connected to the supply-voltage source (u), and a second clock signal (F2) from the clock driver, which is delayed with respect to and overlaps the first clock signal (F1), being applied to the gate of the second memory-cell transistor (ct2).

5. The FIFO memory of claim 1 where in each signal channel (b1 . . . bn), the first memory cell (c . . . 1) is preceded by the demultiplex cell of a demultiplexer (dx), and the last memory cell (c . . . m) is followed by the multiplex cell of a multiplexer (mx).

6. The digital FIFO memory of claim 1:
wherein each memory cell is comprised of transistors of a single conductivity type, namely a transfer transistor (t) in series with a level regenerator (p), particularly a static inverter, with the gate of the transfer transistor (t) being the enable input;
where in each signal channel (b1 . . . bn), the first memory cell (c . . . 1) is preceded by the demultiplex cell of a demultiplexer (dx), and the last memory cell (c . . . m) is followed by the multiplex cell of a multiplexer (mx); and
wherein each demultiplex cell is comprised of:

a series combination of a first additional memory cell (z ... 1) and a second additional memory cell (z ... 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open;

the enable inputs of the other first additional memory cells are controlled by n successively acting input clock signals (e ... ) based on the input data rate (g2), with the first, second, and next-to-last input clock signals (e1, e2, en−1) being applied to the first additional memory cells (z ... 1) in the first signal channel (b1), the second signal channel (b2), and the next-to-last signal channel (bn−1), respectively, and the last input clock signal (en) being applied to all second additional memory cells (z ... 2); and the input data rate (g2) is less than or equal to half the n-fold frequency of the basic clock signal (g1).

7. The digital FIFO memory of claim 1:

wherein each memory cell is comprised of CMOS transistors, namely a first P-channel transistor (p1), a second P-channel transistor (p2), a second N-channel transistor (n2), and a first N-channel transistor (n1) having their controlled current paths connected in series in this order between a positive supply voltage (+u) and the associated negative reference point (−u), with the gates of the first P-channel transistor and the first N-channel transistor connected together to form the input of the memory cell, that a clock signal (G1) derived from the output signal (ta) of the clock driver (tt ... ) is applied to the gate of the second N-channel transistor (n2), that the clock signal inverse thereto (G2) is applied to the gate of the second P-channel transistor (p2), and that the junction point of the two transistors (p2, n2) is the output of the memory cell;

where in each signal channel (b1 ... bn), the first memory cell (c ... 1) is preceded by the demultiplex cell of a demultiplexer (dx), and the last memory cell (c ... m) is followed by the multiplex cell of a multiplexer (mx); and wherein each demultiplex cell comprises:

a series combination of a first additional memory cell (z ... 1) and a second additional memory cell (z ... 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open;

the enable inputs of the other first additional memory cells are controlled by n successively acting input clock signals (e ... ) based on the input data rate (g2), with the first, second, and next-to-last input clock signals (e1, e2, en−1) being applied to the first additional memory cells (z ... 1) in the first signal channel (b1), the second signal channel (b2), and the next-to-last signal channel (bn−1) respectively, and the last input clock signal (en) being applied to all second additional memory cells (z ... 2), and the input data rate (g2) is less than or equal to half the n-fold frequency of the basic clock signal (g1).

8. The digital FIFO memory of claim 1:

wherein each memory cell is comprised of transistors of a single conductivity type, namely a transfer transistor (t) in series with a level regenerator (p), particularly a static inverter, with the gate of the transfer transistor (t) being the enable input;

wherein each demultiplex cell comprises:

a series combination of a first additional memory cell (z ... 1) and a second additional memory cell (z ... 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open;

the enable inputs of the other first additional memory cells are controlled by n successively acting input clock signals (e ... ) based on the input data rate (g2), with the first, second, and next-to-last input clock signals (e1, e2, en−1) being applied to the first additional memory cells (z ... 1) in the first signal channel (b1), the second signal channel (b2), and the next-to-last signal channel (bn−1), respectively, and the last input clock signal (en) being applied to all second additional memory cells (z ... 2); and the input data rate (g2) is less than or equal to half the n-fold frequency of the basic clock signal (g1), and wherein each multiplex cell is formed by a series combination of a third additional memory cell (z ... 3) and an additional transfer transistor (zt ... ), with the third additional memory cell (z ... 3) being of the same design as the memory cells (c ... ), and the transfer transistor in the third additional memory cell of the first signal channel (b1) omitted;

the gates of the transfer transistors of the multiplex cells are controlled by output clock signals (s ... ) based on the output data rate (g3), with the first output clock signal (s1) being applied to the third additional memory cells (z ... 3) of the second to the last signal channel (b2 ... bn), and the first, second, next-to-last, and last output clock signals (s1, s2, sn−1), sn) being applied to the first, second, next-to-last, and last additional transfer transistors (zt ... ), respectively; and the output data rate (g3) is less than or equal to half the n-fold frequency of the basic clock signal (g1).

9. The digital FIFO memory of claim 1:

wherein each memory cell is comprised of CMOS transistors, namely a first P-channel transistor (p1), a second P-channel transistor (p2), a second N-channel transistor (n2), and a first N-channel transistor (n1) having their controlled current paths connected in series in this order between a positive supply voltage (+u) and the associated negative reference point (−u), with the gates of the first P-channel transistor and the first N-channel transistor connected together to form the input of the memory cell, that a clock signal (G1) derived from the output signal (ta) of the clock driver (tt ... ) is applied to the gate of the second N-channel transistor (n2), that the clock signal inverse thereto (G2) is applied to the gate of the second P-channel transistor (p2), and that the junction point of the two transistors (p2, n2) is the output of the memory cell;

wherein each demultiplex cell comprises:

a series combination of a first additional memory cell (z ... 1) and a second additional memory cell (z ...

. 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open;

the enable inputs of the other first additional memory cells are controlled by n successively acting input clock signals (e . . . ) based on the input data rate (g2), with the first, second, and next-to-last input clock signals (e1, e2, en−1) being applied to the first additional memory cells (z . . . 1) in the first signal channel (b1), the second signal channel (b2), and the next-to-last signal channel (bn−1), respectively, and the last input clock signal (en) being applied to all second addtional memory cells (z . . . 2); and the input data rate (g2) is less than or equal to half the n-fold frequency of the basic clock signal (g1); and wherein each multiplex cell is formed by a series combination of a third additional memory cell (z . . . 3) and a fourth additional memory cell (Z . . . 4) of the same design as the memory cells (c . . . ), with the fourth additional memory cell of the first signal channel (b1) omitted;

the enable inputs of these two additional memory cells are controlled by output clock signals (s . . . ) based on the output data rate (g3), with the first output clock signal (s1) being applied to the third additional memory cells (z . . . 3), and the second, next-to-last, and last output clock signals (s2, sn−1, sn) being applied to the fourth additional memory cells (z . . . 4) of the second to the last signal channel (b2 . . . bn), respectively;

in the first signal channel (b1), the first additional memory cell (z11) is preceded by a static inverter (si) implemented in the same technology (e.g., N-channel, CMOS) as the memory cells; and the output data rate (g3) is less than or equal to half the n-fold frequency of the basic clock signal (g1).

10. The digital FIFO memory of claim 1:

wherein each memory cell is comprised of transistors of a single conductivity type, namely a series combination formed by the controlled current paths of a first memory-cell transistor (ct1), a second memory-cell transistor (ct2), and a third memory-cell transistor (ct3) and beginning at the live terminal of a supply-voltage source (u), the gate of the third memory-cell transistor (ct3) being the input of the memory cell, the junction point of the first and second memory-cell transistors (ct1, ct2) forming the output of the memory cell, a first clock signal (F1) from the clock driver being applied to the gate of the first memory-cell transistor (ct1) and to the end of the series combination not connected to the supply-voltage source (u), and a second clock signal (F2) from the clock driver, which is delayed with respect to and overlaps the first clock signal (F1), being applied to the gate of the second memory-cell transistor (ct2);

wherein each demultiplex cell comprises:

a series combination of a first additional memory cell (z . . . 1) and a second additional memory cell (z . . . 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open;

the enable inputs of the other first additional memory cells are controlled by n successively acting input clock signals (e . . . ) based on the input data rate (g2), with the first, second, and next-to-last input clock signals (e1, e2, en−1) being applied to the first additional memory cells (z . . . 1) in the first signal channel (b1), the second signal channel (b2), and the next-to-last signal channel (bn−1), respectively, and the last input clock signal (en) being applied to all second additional memory cells (z . . . 2); and the input data rate (g2) is less than or equal to half the n-fold frequency of the basic clock signal (g1), and wherein each multiplex cell is formed by a series combination of a third additional memory cell (z . . . 3) and an additional transfer transistor (zt . . . ), with the third additional memory cell (z . . . 3) being of the same design as the memory cells (c . . . ), and the transfer transistor in the third additional memory cell of the first signal channel (b1) omitted;

the gates of the transfer transistors of the multiplex cells are controlled by output clock signals (s . . . ) based on the output data rate (g3), with the first output clock signal (s1) being applied to the third additional memory cells (z . . . 3) of the second to the last signal channel (b2 . . . bn), and the first, second, next-to-last, and last output clock signals (s1, s2, sn−1, sn) being applied to the first, second, next-to-last, and last additional transfer transistors (zt . . . ), respectively; and the output data rate (g3) is less than or equal to half the n-fold frequency of the basic clock signal (g1).

11. The digital FIFO memory of claim 1:

wherein each multiplex cell is formed by a series combination of a third additional memory cell (z . . . 3) and an additional transfer transistor (zt . . . ), with the third additional memory cell (z . . . 3) being of the same design as the memory cells (c . . . ), and the transfer transistor in the third additional memory cell of the first signal channel (b1) omitted;

the gates of the transfer transistors of the multiplex cells are controlled by output clock signals (s . . . ) based on the output data rate (g3), with the first output clock signal (s1) being applied to the third additional memory cells (z . . . 3) of the second to the last signal channel (b2 . . . bn), and the first, second, next-to-last, and last output clock signals (s1, s2, sn−1, sn) being applied to the first, second, next-to-last, and last additional transfer transistors (zt . . . ), respectively; and the output data rate (g3) is less than or equal to half the n-fold frequency of the basic clock signal (g1);

wherein the basic clock signal (g1) is the shift signal for a first n-stage ring counter (rz1);

whose stage outputs provide the n input clock signals (e . . . );

to which the reset signal (rs) is applied;

which is connected to the data request output line (ra) of the first clock driver (tt1); and in which the output of the last stage is coupled to the data availability input line (ve) of the first clock driver (tt1); and that the output data rate (g3) is the shift signal for a second ring counter (rz2);

whose stage outputs provide the n output clock signals (s . . . );
to which the reset signal (rs) is applied; and
in which the output of the first stage is coupled to the data request input line (re) of the last clock driver (ttn).

12. The digital FIFO memory of claim 1:
wherein each multiplex cell is formed by a series combination of a third additional memory cell (z . . . 3) and a fourth additional memory cell (Z . . . 4) of the same design as the memory cells (c . . . ), with the fourth addtiional memory cell of the first signal channel (b1) omitted;
the enable inputs of these two additional memory cells are controlled by output clock signals (s . . . ) based on the output data rate (g3), with the first output clock signal (s1) being applied to the third additional memory cells (z . . . 3), and the second, next-to-last, and last output clock signals (s2, sn−1, sn) being applied to the fourth additional memory cells (z . . . 4) of the second to the last signal channel (b2 . . . bn), respectively;
in the first signal channel (b1), the first additional memory cell (z11) is preceded by a static inverter (si) implemented in the same technology (e.g., N-channel, CMOS) as the memory cells; and
the output data rate (g3) is less than or equal to half the n-fold frequency of the basic clock signal (g1);
wherein the basic clock signal (g1) is the shift signal for a first n-stage ring counter (rz1);
whose stage outputs provide the n input clock signals (e . . . );
to which the reset signal (rs) is applied;
which is connected to the data request output line (ra) of the first clock driver (tt1); and
in which the output of the last stage is coupled to the data availability input line (ve) of the first clock driver (tt1); and
that the output data rate (g3) is the shift signal for a second ring counter (rz2);
whose stage outputs provide the n output clock signals (s . . . );
to which the reset signal (rs) is applied; and
in which the output of the first stage is coupled to the data request input line (re) of the last clock driver (ttn).

13. The digital FIFO memory of claim 1:
wherein each multiplex cell is formed by a series combination of a third additional memory cell (z . . . 3) and an additional transfer transistor (zt . . . ), with the third additional memory cell (z . . . 3) being of the same design as the memory cells (c . . . ), and the transfer transistor in the third additional memory cell of the first signal channel (b1) omitted;
the gates of the transfer transistors of the multiplex cells are controlled by output clock signals (s . . . ) based on the output data rate (g3), with the first output clock signal (s1) being applied to the third additional memory cells (z . . . 3) of the second to the last signal channel b2 . . . bn), and the first, second, next-to-last, and last output clock signals (s1, s2, sn−1), sn) being applied to the first, second, next-to-last, and last additional transfer transistors (zt . . . ), respectively; and
the output data rate (g3) is less than or equal to half the n-fold frequency of the basic clock signal (g1);
wherein the basic clock signal (g1) is the shift signal for a first n-stage ring counter (rz1);
whose stage outputs provide the n input clock signals (e . . . );
to which the reset signal (rs) is applied;
which is connected to the data request output line (ra) of the first clock driver (tt1); and
in which the output of the last stage is coupled to the data availability input line (ve) of the first clock driver (tt1); and
that the output data rate (g3) is the shift signal for a second ring counter (rz2);
whose stage outputs provide the n output clock signals (s . . . );
to which the reset signal (rs) is applied; and
in which the output of the first stage is coupled to the data request input line (re) of the last clock driver (ttn);
wherein the basic clock signal (g1), the input data rate (g2), and the output data rate (g3) are non-overlapping two-phase signals (f1, f1q; f2, f2q; f3, f3q) of corresponding frequency, the first (f . . . ) of each each of which leads the second (f . . . q).

14. The digital FIFO memory of claim 1:
wherein each memory cell is comprised of transistors of a single conductivity type, namely a transfer transistor (t) in series with a level regenerator (p), particularly a static inverter, with the gate of the transfer transistor (t) being the enable input; and
wherein each demultiplex cell is comprised of:
a series combination of a first additional memory cell (z . . . 1) and a second additional memory cell (z . . . 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open;
the enable inputs of the other first additional memory cells are controlled by n successively acting input clock signals (e . . . ) based on the input data rate (g2), with the first, second, and next-to-last input clock signals (e1, e2, en−1) being applied to the first additional memory cells (z . . . 1) in the first signal channel (b1), the second signal channel (b2), and the next-to-last signal channel (bn−1), respectively, and the last input clock signal (en) being applied to all second additional memory cells (z . . . 2); and
the input data rate (g2) is less than or equal to half the n-fold frequency of the basic clock signal (g1);
wherein the basic clock signal (g1) is the shift signal for a first n-stage ring counter (rz1);
whose stage outputs provide the n input clock signals (e . . . );
to which the reset signal (rs) is applied;
which is connected to the data request output line (ra) of the first clock driver (tt1); and
in which the output of the last stage is coupled to the data availability input line (ve) of the first clock driver (tt1); and
that the output data rate (g3) is the shift signal for a second ring counter (rz2);
whose stage outputs provide the n output clock signals (s . . . );
to which the reset signal (rs) is applied; and in which the output of the first stage is coupled to the data request input line (re) of the last clock driver (ttn);

wherein the basic clock signal (g1), the input data rate (g2), and the output data rate (g3) are non-overlapping two-phase signals (f1, f1q; f2, f2q; f3, f3q) of corresponding frequency, the first (f . . . ) of each each of which leads the second (f . . . q);

where in the N-channel clock driver (tt . . . ):

the data availability input line (ve) is connected to the input of a first inverter (i1) having its output coupled to the first input of a NAND gate (ng);

the data availability output line (va) is connected to the output of a first dynamic memory stage (sp1) comprising of three transistors (=differential transistors) (d11, d21, d31) connected in the manner of a differential amplifier between the positive terminal (+u) and the negative terminal (−u) of a DC supply voltage source, which output is the junction point of the control current paths of the differential transistors, and to the second input of the NAND gate (ng);

the gate of the first differential transistor (d11) is the reset input (rs), and the data request input line (re) is connected to the gate of the second differential transistor (d21);

the data request output line (ra) is connected to the output of a clock-switching stage (ss0), to the gate of the third differential transistor (d31), and to the clock output (ta); and the output of the NAND gate (ng) is connected via the controlled current path of a series transistor (1t), to whose gate the second two-phase signal f1q) of the first basic clock signal (g1) is applied, to the input of the clock-switching stage (ss).

15. The digital FIFO memory of claim 1:

wherein the basic clock signal (g1) is the shift signal for a first n-stage ring counter (rz1);

whose stage outputs provide the n input clock signals (e . . . );

to which the reset signal (rs) is applied;

which is connected to the data request output line (ra) of the first clock driver (tt1); and in which the output of the last stage is coupled to the data availability input line (ve) of the first clock driver (tt1); and that the output data rate (g3) is the shift signal for a second ring counter (rz2);

whose stage outputs provide the n output clock signals(s . . . );

to which the reset signal (rs) is applied; and in which the output of the first stage is coupled to the data request input line (re) of the last clock driver (ttn);

wherein a N-channel circuit for the second ring counter (rz2) is comprised of a plurality of stages and each stage comprises:

a master-slave D flip-flop (ff1 . . . ffn) and an additional clock-switching stage (ss1 . . . ssn), the slave portion of the flip-flop (ff1 . . . ffn) having an R input and an S input;

to Qq output of the flip-flop (ff . . . ) is connected to the input of the additional clock-switching stage (ss1 . . . ssn);

the first two-phase signal (fe) of the output data rate (g3) is applied to the additional clock-switching stage (ss1 . . . ssn);

the output of the additional clock-switching stage (ss1 . . . ssn) is the output for the respective output clock signal (s1 . . . sn);

the reset signal (rs) is applied to the S input of the first flip-flop (ff1) and to the R inputs of the second to the nth flip-flop (ff2 . . . ffn);

the flip-flops (ff . . . ) are connected in a ring circuit by coupling the respective Q output to the D input of the following flip-flop; and the output of the first additional clock-switching stage (ss1) is connected to the data request output line (ra) of the nth clock driver (ttn).

16. The digital FIFO memory of claim 1:

wherein the basic clock signal (g1) is the shift signal for a first n-stage ring counter (rz1);

whose stage outputs provide the n input clock signals (e . . . );

to which the reset signal (rs) is applied;

which is connected to the data request output line (ra) of the first clock driver (tt1); and in which the output of the last stage is coupled to the data availability input line (ve) of the first clock driver (tt1); and that the output data rate (g3) is the shift signal for a second ring counter (rz2);

whose stage outputs provide the n output clock signals(s . . . );

to which the reset signal (rs) is applied; and in which the output of the first stage is coupled to the data request input line (re) of the last clock driver (ttn), wherein the N-channel circuit for the first ring counter (rz1) has a plurality of stages and each stage comprises:

a master-slave D flip-flop (ff . . . ) having an R input and an S input at the slave portion;

an additional clock-switching stage (ss . . . ) having its first input connected to the Qq output of the flip-flop (ff . . . ) and having the first two-phase signal (f2) of the input data rate (g2) applied to its second input; and a second dynamic memory stage (sp2) comprising of three transistors (=differential transistors) (d12, d22, d32) connected in the manner of a differential amplifier between the positive and negative terminals of the DC supply voltage source;

the reset signal (rs) is applied to the S input of the first flip-flop (ff1), to the R input of the second to the nth flip-flop (ff2 . . . ffn), and to the gate of the first differential transistor (d12);

the second two-phase signal (f2q) of the input data rate (g2) is applied to the clock inputs of the flip-flops (ff . . . );

the flip-flops (ff . . . ) are connected in a ring circuit by coupling the respective Q output to the D input of the following flip-flop;

connected to the gate of the second differential transistor (d22) is the data request input line (re) of the first clock driver (tt1) and the junction point of the three differential transistors with the data availability output line (va) of the first clock driver (tt1), and the gate of the third differential transistor (d32) is connected to the output of the last additional-clock switching stage (ssn).

17. The digital FIFO memory of claim 14:

wherein the N-channel clock-switching stage (ss . . . ) comprises:

a first transistor (t1) and a second transistor (t2) having their controlled current paths connected in series between the respective first two-phase signal (f2, f3) and the negative terminal (−u);

a third transistor (t3) and a second inverter (i2) are connected between the input of the clock-switching stage (ss . . . ) and the gate of the first transistor (t1);

the input of the clock-switching stage is connected to the gate of the second transistor (t2);

the gate of the third transistor (t3) is connected to the positive terminal (+u) of the supply voltage source; and the output of the clock-switching stage is the junction point of the two transistors (t1, t2).

18. The digital FIFO memory of claim 1:

wherein each memory cell is comprised of transistors of a single conductivity type, namely a series combination formed by the controlled current paths of a first memory-cell transistor (ct1), a second memory-cell transistor (ct2), and a third memory-cell transistor (ct3) and beginning at the live terminal of a supply-voltage source (u), the gate of the third memory-cell transistor (ct3) being the input of the memory cell, the junction point of the first and second memory-cell transistors (ct1, ct2) forming the output of the memory cell, a first clock signal (F1) from the clock driver being applied to the gate of the first memory-cell transistor (ct1) and to the end of the series combination not connected to the supply-voltage source (u), and a second clock signal (F2) from the clock driver, which is delayed with respect to and overlaps the first clock signal (F1), being applied to the gate of the second memory-cell transistor (ct2); and wherein each demultiplex cell is comprised of:

a series combination of a first additional memory cell (z . . . 1) and a second additional memory cell (z . . . 2) having the same internal circuit as the memory cells, with the enable input of the first additional memory cell (zn1) in the demultiplex cell of the last signal channel (bn) connected to a potential (vo) which keeps the input of the first additional memory cell (zn1) constantly open;

the enable inputs of the other first additional memory cells are controlled by n successively acting input clock signals (e . . . ) based on the input data rate (g2), with the first, second, and next-to-last input clock signals (e1, e2, en−1) being applied to the first additional memory cells (z . . . 1) in the first signal channel (b1), the second signal channel (b2), and the next-to-last signal channel (bn−1), respectively, and the last input clock signal (en) being applied to all second additional memory cells (z . . . 2); and the input data rate (g2) is less than or equal to half the n-fold frequency of the basic clock signal (g1);

wherein each multiplex cell is formed by a series combination of a third additional memory cell (z . . . 3) and a fourth additional memory cell (Z . . . 4) of the same design as the memory cells (c . . . ), with the fourth additional memory cell of the first signal channel (b1) omitted;

the enable inputs of these two additional memory cells are controlled by output clock signals (s . . . ) based on the output data rate (g3), with the first output clock signal (s1) being applied to the third additional memory cells (z . . . 3), and the second, next-to-last, and last output clock signals (s2, sn−1, sn) being applied to the fourth additional memory cells (z . . . 4) of the second to the last signal channel (b2 . . . bn), respectively;

in the first signal channel (b1), the first additional memory cell (z11) is preceded by a static inverter (si) implemented in the same technology as the memory cells; and the output data rate (g3) is less than or equal to half the n-fold frequency of the basic clock signal (g1);

wherein the basic clock signal (g1) is the shift signal for a first n-stage ring counter (rz1);

whose stage outputs provide the n input clock signals (e . . . );

to which the reset signal (rs) is applied;

which is connected to the data request output line (ra) of the first clock driver (tt1); and in which the output of the last stage is coupled to the data availability input line (ve) of the first clock driver (tt1); and that the output data rate (g3) is the shift signal for a second ring counter (rz2);

whose stage outputs provide the n output clock signals (s . . . );

to which the reset signal (rs) is applied; and in which the output of the first stage is coupled to the data request input line (re) of the last clock driver (ttn);

where in the N-channel CMOS clock driver (tt . . . ):

the data availability input line (ve) is connected to one input of a NOR gate (nr) clocked by two clock signals;

connected between the supply voltage (+u) and its reference point (−u) is the series combination of a second P-channel transistor (pp2), a third P-channel transistor (pp3), and a third N-channel transistor (nn3), with the gate of the second P-channel transistor (pp2) connected to the output of the NOR gate (nr), and the junction point of the two third transistors connected through a second static inverter (ci2) to the output for the second clock signal (F2);

the output of the NOR gate (nr) is connected to the clock input of an inverter (ei) clocked by a single clock signal;

the output of this inverter (ei) is connected to the gate of the first P-channel transistor (pp1) and, through a third static inverter (ci3), to the gate of the third N-channel transistor (nn3) and to the output for the first clock signal (F1); and from the basic clock signal (g1), a first pair (m1, m1q) and a second pair (m2, m2q) of nonoverlapping CMOS clock signals are derived, the first signal (m1) of the first pair being applied to the gate of the inverter (ei) clocked by a single clock signal, the first signal (m2) of the second pair being applied to the gate of the third P-channel transistor (pp3), and the second pair (m2, m2q) being applied to the NOR gate (nr).

* * * * *